US011189655B1

(12) United States Patent
Mun

(10) Patent No.: US 11,189,655 B1
(45) Date of Patent: Nov. 30, 2021

(54) ISOLATION STRUCTURE FOR SUPPRESSING FLOATING DIFFUSION JUNCTION LEAKAGE IN CMOS IMAGE SENSOR

(71) Applicant: OmniVision Technologies, Inc., Santa Clara, CA (US)

(72) Inventor: Seong Yeol Mun, Santa Clara, CA (US)

(73) Assignee: OMNIVISION TECHNOLOGIES, INC., Santa Clara, CA (US)

(*) Notice: Subject to any disclaimer, the term of this patent is extended or adjusted under 35 U.S.C. 154(b) by 18 days.

(21) Appl. No.: 16/946,841

(22) Filed: Jul. 8, 2020

(51) Int. Cl.
*H01L 27/146* (2006.01)
*H01L 21/762* (2006.01)
*H01L 21/761* (2006.01)

(52) U.S. Cl.
CPC ........ *H01L 27/1463* (2013.01); *H01L 21/761* (2013.01); *H01L 21/76229* (2013.01); *H01L 27/14603* (2013.01); *H01L 27/14612* (2013.01); *H01L 27/14643* (2013.01); *H01L 27/14641* (2013.01)

(58) Field of Classification Search
CPC ............. H01L 29/0646; H01L 29/0623; H01L 21/761; H01L 21/76229; H01L 21/76224–76237; H01L 27/1463; H01L 27/14612; H01L 27/14616; H01L 27/14641; H01L 27/14603
See application file for complete search history.

(56) References Cited

U.S. PATENT DOCUMENTS

| | | | |
|---|---|---|---|
| 2011/0180689 A1* | 7/2011 | Roy | H01L 27/14609 250/208.1 |
| 2013/0217173 A1* | 8/2013 | Chen | H01L 27/1463 438/73 |
| 2015/0115337 A1* | 4/2015 | Yang | H01L 27/1463 257/292 |
| 2016/0020246 A1* | 1/2016 | Wang | H01L 21/02065 438/59 |
| 2016/0093651 A1* | 3/2016 | Sato | H01L 27/14638 257/229 |
| 2019/0043901 A1* | 2/2019 | Honda | H01L 27/14614 |
| 2019/0115388 A1* | 4/2019 | Jung | H01L 27/1464 |
| 2019/0237499 A1* | 8/2019 | Roy | H01L 27/1461 |
| 2020/0266221 A1* | 8/2020 | Uchida | H01L 27/1461 |
| 2020/0350355 A1* | 11/2020 | Raynor | H01L 27/14603 |
| 2021/0082974 A1* | 3/2021 | Uchida | H01L 27/14614 |
| 2021/0225924 A1* | 7/2021 | Mun | H01L 27/14645 |
| 2021/0225927 A1* | 7/2021 | Mun | H01L 27/14632 |

\* cited by examiner

*Primary Examiner* — Yu Chen
(74) *Attorney, Agent, or Firm* — Christensen O'Connor Johnson Kindness PLLC

(57) ABSTRACT

A pixel array is provided that addresses leaking current at or near the floating diffusion region of the pixel cells. The pixel array includes an arrangement of trench isolation structures, including both front side deep trench isolation structure and front side shallow trench isolation structure that isolate the transistor channel regions from the pixel regions (e.g., photodiodes) of the pixel array. Example embodiments also include deep (N) doped wells that extend beneath the pixel transistor regions in order to "float" the P-well regions of the pixel transistor regions.

20 Claims, 6 Drawing Sheets

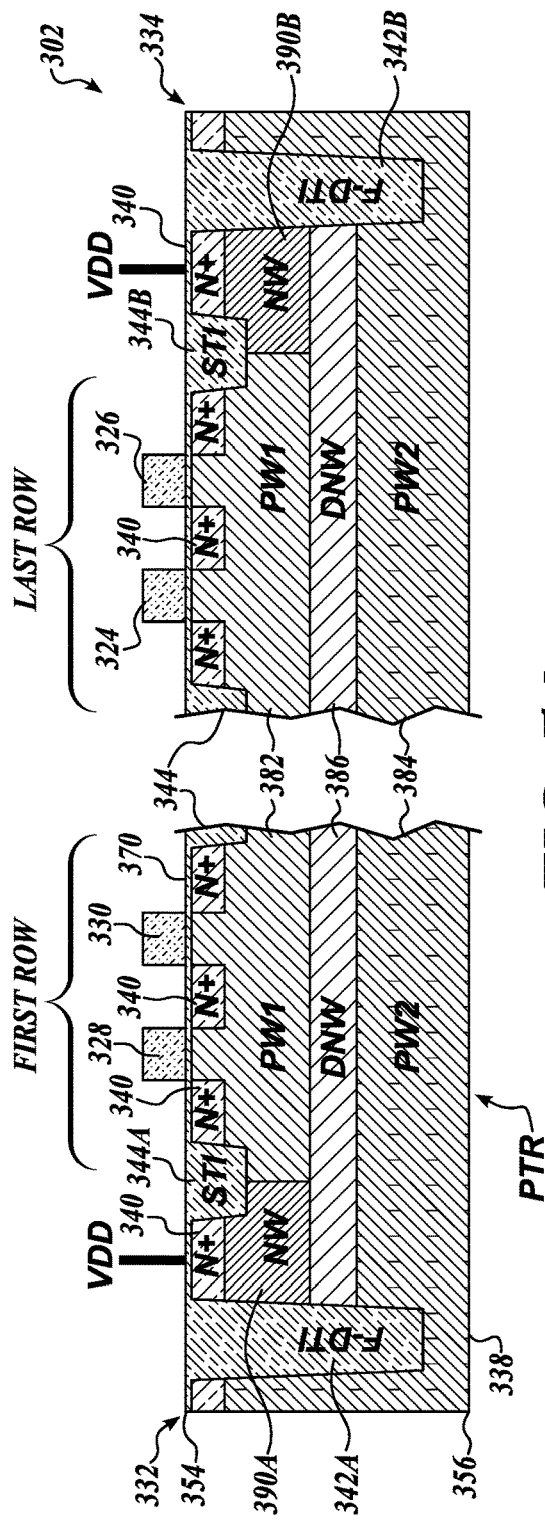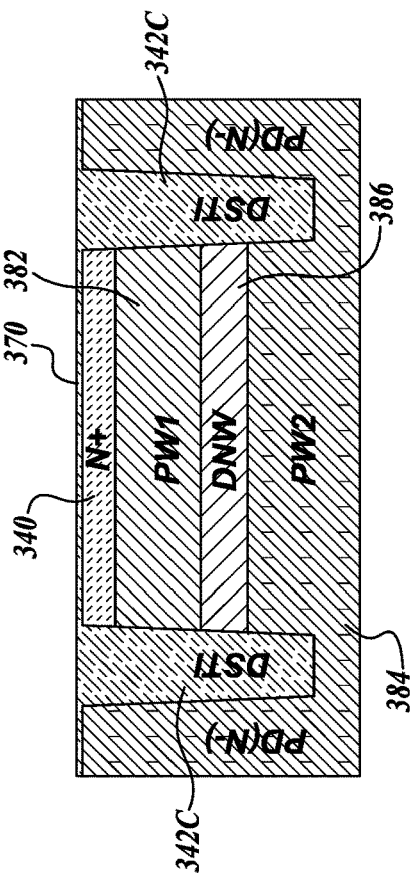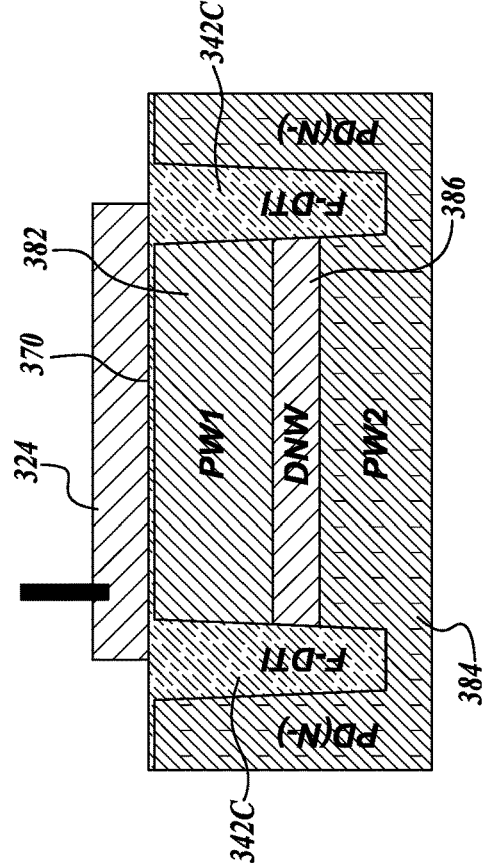
FIG. 5A
FIG. 5B
FIG. 5C

… (1)

ISOLATION STRUCTURE FOR SUPPRESSING FLOATING DIFFUSION JUNCTION LEAKAGE IN CMOS IMAGE SENSOR

BACKGROUND INFORMATION

Field of the Disclosure

This disclosure relates generally to image sensors, and in particular but not exclusively, relates to image sensors, such as high dynamic range (HDR) image sensors, that aim to suppress floating diffusion junction leakage.

Background

CMOS image sensors (CIS) have become ubiquitous. They are widely used in digital still cameras, cellular phones, security cameras, as well as medical, automobile, and other applications. The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

Integrated circuit (IC) technologies for image sensors are constantly being improved, especially with the constant demand for higher resolution and lower power consumption. Such improvements frequently involve scaling down device geometries to achieve lower fabrication costs, higher device integration density, higher speeds, and better performance.

But as the miniaturization of image sensors progresses, defects within the image sensor architecture become more readily apparent and may reduce the image quality of the image. For example, excess current leakage within certain regions of the image sensor may cause high dark current, sensor noise, white pixel defects, and the like. These defects may significantly deteriorate the image quality from the image sensor, which may result in reduced yield and higher production costs.

High dynamic range (HDR) image sensors may present other challenges. For example, some HDR image sensor layouts are not space efficient and are difficult to miniaturize to a smaller pitch to achieve higher resolutions. In addition, due to the asymmetric layouts of many of these HDR image sensors, reducing the size and pitch of the pixels to realize high resolution image sensors result in crosstalk or other unwanted side effects, such as diagonal flare that can occur in these image sensors as the pitches are reduced.

BRIEF DESCRIPTION OF THE DRAWINGS

FIGS. 5A-5C are schematic cross sectional views of the pixel array, taken along lines A-A of FIG. 3, and along lines B-B and C-C of FIG. 4, respectively.

Figure 1:
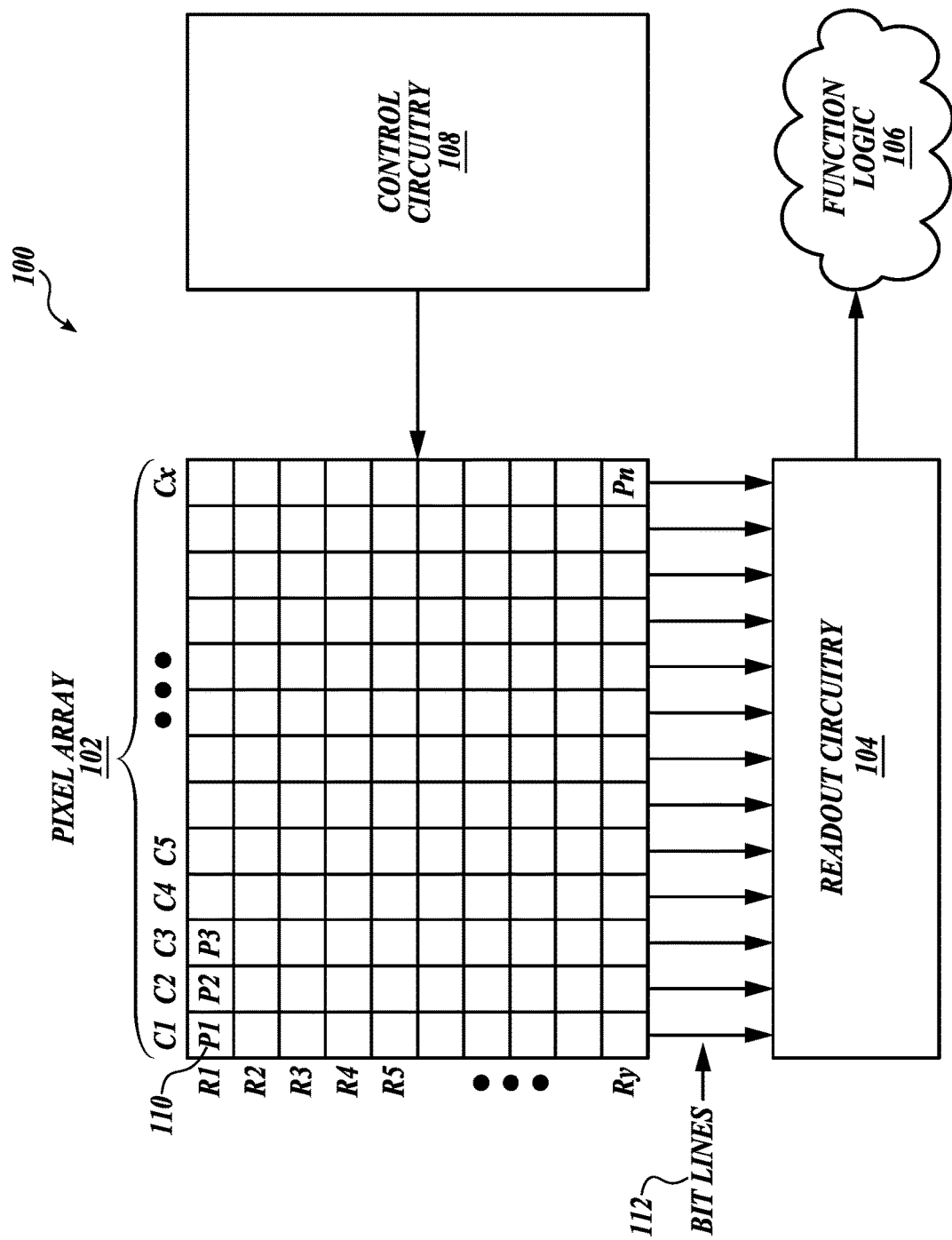
FIG. 1 illustrates one example of an image sensor according to an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

Examples of an apparatus and method for suppressing floating diffusion junction leakage in CMOS image sensors are described herein. Thus, in the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly.

Additionally, it will also be understood that when a layer is referred to as being "between" two layers, it can be the only layer between the two layers, or one or more intervening layers may also be present. Similarly, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be shown, examples of a pixel array of an image sensor are disclosed. The pixel array comprises one or more of examples of a pixel cell and can be employed, for instance, for high dynamic range imaging. In some examples, the pixel cells of the pixel array can employ 4T or 5T pixel architectures. In some examples, a shared pixel cell architecture is employed in which two or more photoelectric conversion regions, such as pixel or photodiode regions PRs, are coupled to a common floating diffusion via first and second transfer gates.

In other examples of the pixel array, each pixel cell is configured according to a LOFIC architecture. In a pixel cell with a LOFIC architecture, or LOFIC pixel cell, a lateral overflow integrated capacitor (LOFIC) and an associated select transistor, sometimes referred to as a Dual Floating Diffusion (DFD) transistor, are provided. When, for example, the photodiode is filled after reaching saturation, the excess charge is leaked into the floating diffusion (FD) region and can be stored in the LOFIC. Leaking charges in this manner functions like a photodiode with an increasing full well capacity (FWC). Selective increases/decreases in the capacitance of the floating diffusion (FD) of the pixel cell can be utilized to modulate conversion gains. This results in a significant increase the signal/noise ratio (SNR), thereby increasing the dynamic-range (e.g., HDR) of the pixel cell for various HDR imaging applications.

While a LOFIC architecture may be used to increase dynamic range, such an architecture is not without problems. For example, leakage current at or near the floating diffusion region(s) may impact signal readout from the floating diffusion region(s) by readout circuitry due to deficiencies such as a high dark current, white pixel defects, low signal-to-noise ratio, and the like. White pixel defects, for example, may be related to current leakage from regions subjected to mechanical stress during fabrication, electrical stress during device operation, or a combination thereof. Leakage current may be a particularly significant issue when the image charge, image data, or image signal is stored within the floating diffusion region(s) for long periods of time before readout, which sometimes occurs in LOFIC pixel cells.

In addition, leakage by Generation-Recombination (GR) in the floating diffusion junction, especially with the use of highly doped, ohmic contacts, is inevitable. Floating diffusion junction leakage in dark mode (i.e., no light) is stored in the LOFIC during integration, contributing to dark-current/white pixel issues. In fact, dark-current caused by floating diffusion junction leakage is one of the biggest issues attributable to a LOFIC architecture.

For example, in the case of high conversion gain (HCG), the dark-current caused by floating diffusion junction leakage is typically not an issue, because the floating diffusion is reset before signal read-out, and as such, read noise (including noise caused by junction leakage) can be eliminated by a correlated double sampling (CDS) operation. However, the floating diffusion junction leakage induced dark-current can be a significant issue in low conversion gain (LCG), because the signal is read out before reset-level read-out. As such, a correlated double sampling (CDS) operation cannot be applied to remove junction leakage noise. And if the signal is reset before it is read out, all the charges stored are depleted via discharge.

The methodologies and technologies of the present disclosure seek to address these issues associated with pixel arrays comprised of pixel cells having a LOFIC architecture, or others. For instance, examples of the disclosed subject matter aim to minimize or reduce the leaking current at or near the floating diffusion region of the pixel cells for facilitating increased image quality, increased yield, faster speed, etc. In particular, examples of the disclosed subject matter reduce diffusion leakage (e.g., gate induced drain leakage, junction leakage, etc.) associated with the floating diffusion region of, for example, a shared-pixel design.

As will be described in more detail below, the transistors of each pixel cell in example embodiments may be of the N-metal-oxide-semiconductor (NMOS) type, in which the metal may be polycrystalline silicon (poly-Si), tungsten (W) and the like, the oxide may be a dielectric such as silicon oxide $SiO_2$ (e.g., thermally grown or deposited on the semiconductor substrate or material), and the semiconductor may correspond to a portion of the semiconductor substrate or material, such as silicon (e.g., single crystal or polycrystalline Si), silicon on insulator (SOI), etc.

To illustrate, FIG. 1 illustrates a block diagram illustrating an example Image sensor 100, such as an HDR image sensor, in accordance with technologies and methodologies of the present disclosure. Image sensor 100 may be implemented as complementary metal-oxide-semiconductor ("CMOS") image sensor. As shown in the example illustrated in FIG. 1, image sensor 100 includes a pixel array 102 coupled to control circuitry 108 and readout circuitry 104, which is coupled to function logic 106.

The illustrated embodiment of pixel array 102 is a two-dimensional ("2D") array of imaging sensors or pixel cells 110 (e.g., pixel cells P1, P2, . . . , Pn). In one example, each pixel cell includes one or more subpixels or pixel regions that can be used for HDR imaging in accordance with technologies and methodologies of the present disclosure. As illustrated, each pixel cell 110 is arranged into a row (e.g., rows R1 to Ry) and a column (e.g., columns C1 to Cx) to acquire image data of a person, place or object, etc., which can then be used to render an image of the person, place or object, etc. In this example, the pixel cells along row R1 are referred to as the first or uppermost row of pixel cells, and the pixel cells of row Ry are referred to as the last or lowermost row of pixel cells. As will be described in greater detail below, isolation structure is provided at the upper and lower ends of the pixel array proximate the first row of pixel cells and the last row of pixel cells, respectively, and between pixel cells and pixel transistor regions in accordance with technologies and methodologies of the present disclosure. Isolation structure is further provided in a grid-like pattern throughout the pixel array, as will be described in more detail below.

In one example, after each pixel cell 110 has acquired its image data or image charge, the image data is read out by readout circuitry 104 through readout column bitlines 112 and then transferred to function logic 106. In various examples, readout circuitry 104 may include amplification circuitry (not illustrated), a column readout circuit that includes analog-to-digital conversion (ADC) circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For instance, in one example control circuitry 108 generates the transfer gate signals and other control signals to control the transfer and readout of image data from the subpixels or pixel regions of the shared pixel cell 110 of pixel array 102. In addition, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

In one example, the control circuitry 108 may control the timing of various control signals provided to the pixel cell 110 to reduce the dark current associated with floating diffusions of each of the pixel cells 110. The pixel cells 110, in some non-limiting embodiments, may be what are known as 4T pixel cells, e.g., four-transistor pixel cells. In other non-limiting embodiments, the pixel cells are of a shared pixel architecture in which two or more photosensitive regions, such as photodiode regions, are coupled to a common floating diffusion via first and second transfer gates, and include three or more pixel transistors, such as a reset transistor, a source follower, a row select transistor, and dual floating diffusion transistor For example, the pixel cells 110 in some non-limiting embodiments may further include a dual floating diffusion (DFD) transistor and an associated capacitor (e.g., LOFIC). The associated capacitor may be selectively coupled via the dual floating diffusion transistor to increase/decrease the capacitance of the floating diffusion, which can modulate conversion gains.

In one example, image sensor 100 may be included in a digital camera, cell phone, laptop computer, or the like. Additionally, image sensor 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to image sensor 100, extract image data from image sensor 100, or manipulate image data supplied by image sensor 100.

Figure 2:
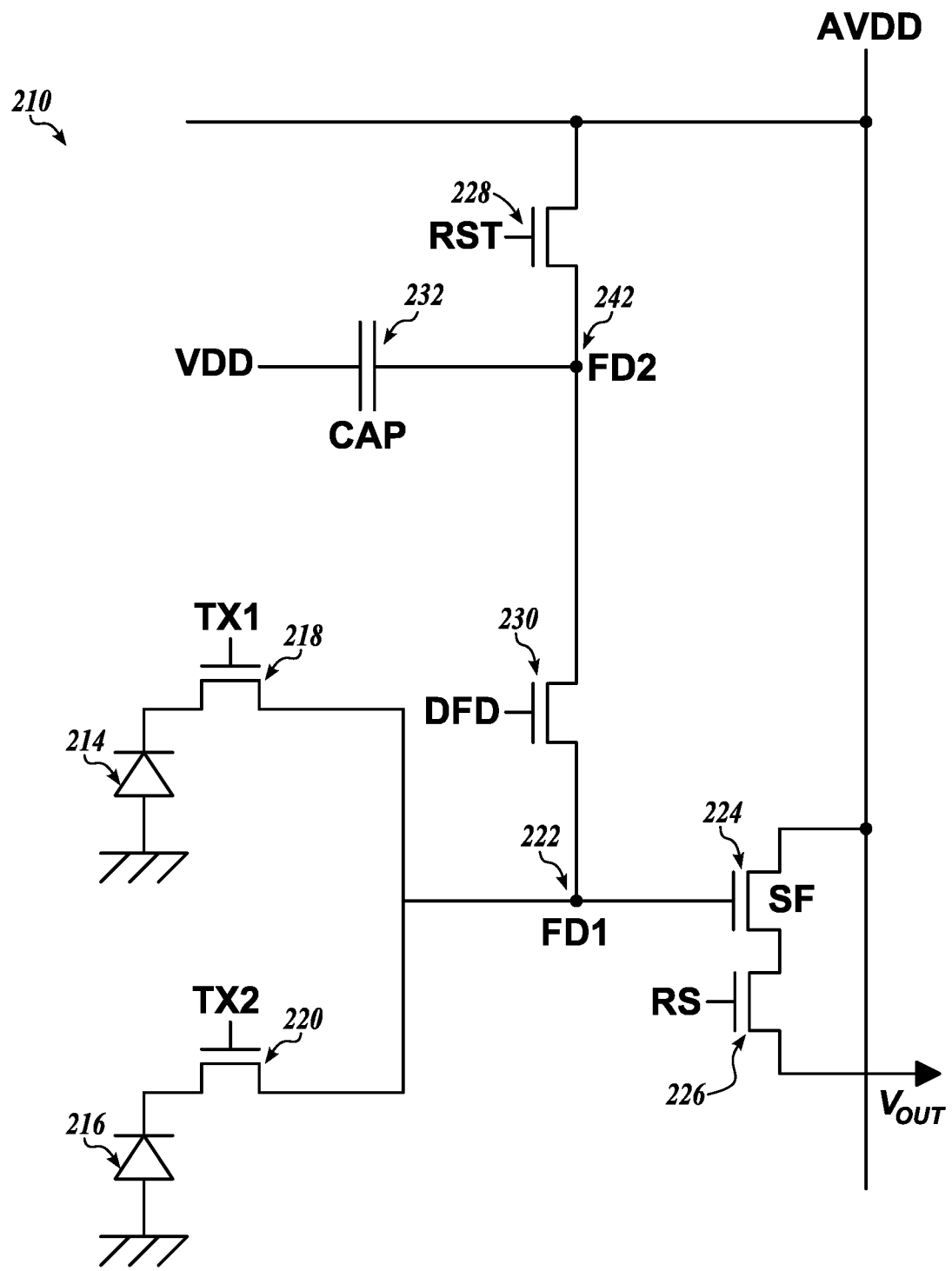
FIG. 2 is an illustrative schematic of one example of a pixel cell in accordance with an embodiment of the present disclosure.

FIG. 2 is an illustrative schematic of an example pixel cell 210 in accordance with the teachings of the present disclosure. It is appreciated that pixel cell 210 of FIG. 2 may be an example of a pixel cell 110 of FIG. 1, and that similarly named and numbered elements referenced below may be coupled and function similar to as described above. The illustrated pixel cell 110 is a shared pixel cell, i.e., include two or more photosensitive or photoelectric conversion elements and a common charge detection element e.g., floating diffusion region. For example, the pixel cell 210 may be coupled to a bitline, e.g., readout column, which may provide image data to readout circuitry, such as the readout circuitry 104, and the pixel cell 210 may receive control signals from control circuitry, such as control circuitry 108, to control the operation of the various transistors of the pixel cell 210. The control circuitry 108 may control the operation of the transistors in desired sequences with relative timing in order to reset the pixel to a dark state, for example, and to read out image data after an integration, for example.

The illustrated example of the pixel cell 210 includes a first photosensitive or photoelectric conversion element, such as first photodiode 214, and a second photosensitive or photoelectric conversion element, such as second photodiode 216. In operation, the first and second photodiodes 214, 216 are coupled to photogenerate image charge in response to incident light. In an embodiment, the first and second photodiodes 214 and 216 can be used to provide image data for a high dynamic range (HDR) image, for example.

Pixel cell 210 also includes a first transfer gate 218, a second transfer gate 220, and a first floating diffusion (FD1) 222 disposed between the first and second transfer gates 218, 220. First transfer gate 218 is coupled to transfer image charge from first photodiode 214 to the first floating diffusion 222 in response to a first transfer gate signal TX1. Second transfer gate 220 is coupled to transfer image charge from second photodiode 214 to the first floating diffusion 222 in response to a second transfer gate signal TX2. In the depicted arrangement, the first floating diffusion 222 is common to both the first and second photodiodes 214, 216, and can be referred to as a common floating diffusion 222.

A reset transistor 228 is coupled to the common floating diffusion 222 to reset the pixel cell 210 (e.g., discharge or charge the first and second photodiodes 214, 216, and the first floating diffusion 222 to a preset voltage) in response to a reset signal RST. The gate terminal of an amplifier transistor 224 is also coupled to the first floating diffusion 222 to generate an image data signal in response to the image charge in the first floating diffusion 222. In the illustrated example, the amplifier transistor 224 is coupled as a source-follower (SF) coupled transistor. A row select transistor 226 is coupled to the amplifier transistor SF 224 to output the image data signal to an output bitline 212, which is coupled to readout circuitry such as readout circuitry 104 of FIG. 1, in response to a row select signal RS.

In another example embodiment, a dual floating diffusion transistor 230 may be optionally coupled between the first floating diffusion 222 and the reset transistor 228. A capacitor (CAP) 232, such as a LOFIC, also may be optionally included and coupled to the dual floating diffusion transistor 230 to form a LOFIC pixel cell. When included, a second floating diffusion (FD2) 242 is formed between the reset transistor 228 and the dual floating diffusion transistor 230. In operation, the dual floating diffusion transistor 230 is adapted to couple the capacitor 232 to the first floating diffusion 222 in response to a dual floating diffusion signal DFD to provide additional dynamic range capabilities to the pixel cell 210 if desired. In the depicted arrangement, the capacitor 232 is also coupled to a voltage, such as voltage VDD, for adjusting the capacitance of the capacitor 232 to store overflowing or excess charges from the pixel cell 210 during operation of the HDR CMOS image sensor.

Control signals TX1 and TX2 enable the transfer gates 218, 220 to transfer the charges from the photodiodes 214, 216 to the first floating diffusion 222. The amount of charges transferred from the photodiodes to the floating diffusion may depend on a current operation of the pixel cell 210. For example, during a reset operation, the charge may be charge generated in a dark state of the photodiode(s), but during an integration, the charge may be photogenerated image charge in response to incident light. At the end of an integration, the image charge may be readout twice with one or more dark readings occurring between the two to perform correlated double sampling (CDS).

Figure 3:
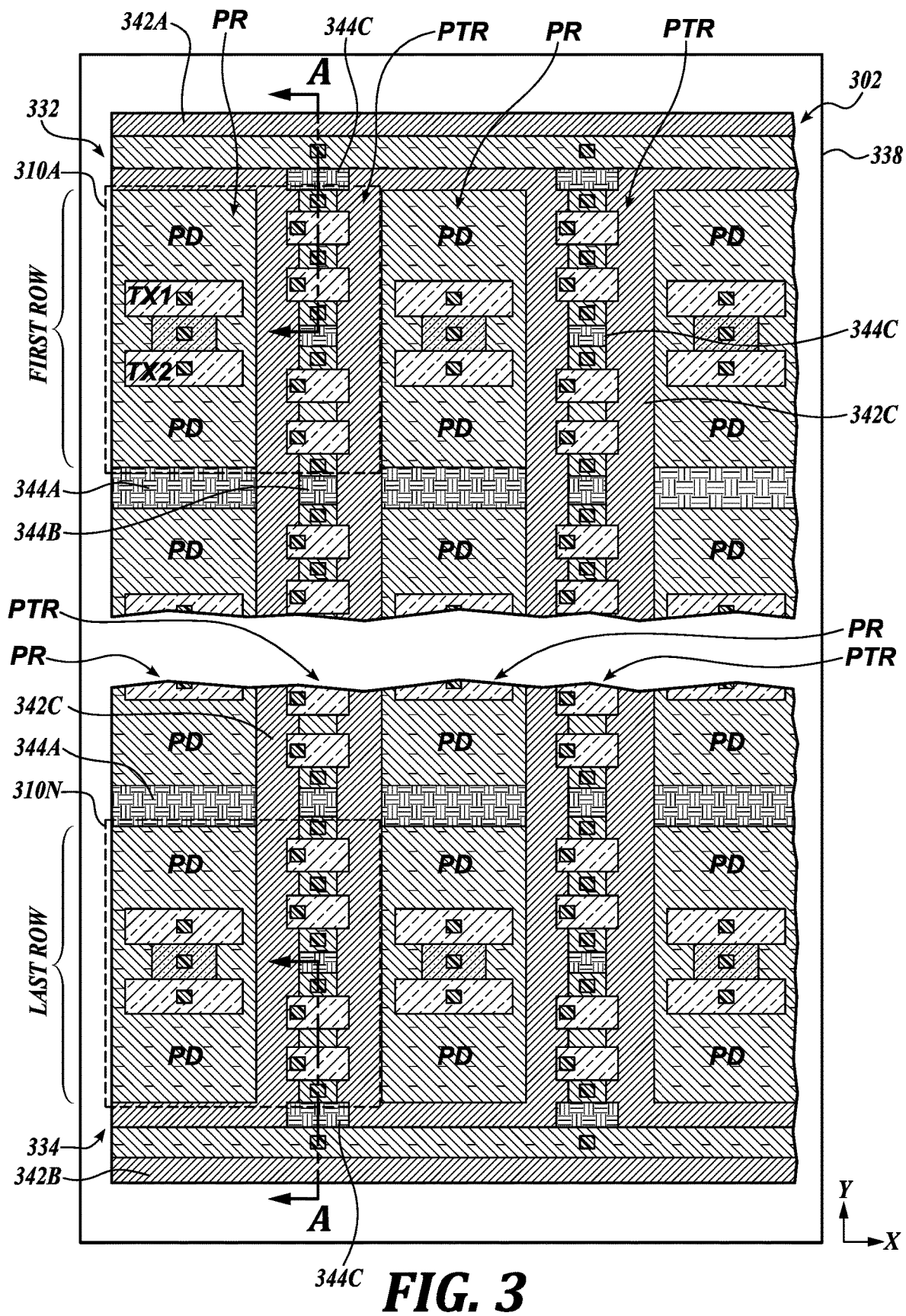
FIG. 3 is a top schematic partial view of one example of a pixel array in accordance with an embodiment of the present disclosure.

FIG. 3 is a layout schematic view, or top schematic view, of an example pixel array 302 comprising one or more pixel cells 310A-310N in accordance with technologies and methodologies of the present disclosure. It is appreciated that the pixel cells 310 of FIG. 3 may be an example of pixel cell 210 of FIG. 2, or an example of pixel cell 110 of FIG. 1, and that similarly named and numbered elements referenced below may be coupled and function similar to as described above.

As shown in the example depicted in FIG. 3, the pixel array 302 includes a plurality of pixel cells 310 formed in a semiconductor substrate or material 338 and arrange in a matrix of rows and columns. In that regard, the pixel array 302 includes a first or uppermost row of pixel cells 310 disposed at a first end 332, a last or lowermost row of pixel cells 310 disposed at a second end 334, and a plurality of rows of pixel cells 310 disposed between the first row and the last row of pixel cells. In embodiments, the plurality of rows of pixel cells 310 disposed between the first row and the last row of pixel cells can be referred as middle rows of pixel cells 310 or pixel cells 310 associated with middle rows.

In an example embodiment, there are provided deep trench isolation (DTI) structure 342 extending a first depth into the semiconductor material 338 from the front side of the semiconductor material 338. For example, deep trench isolation (DTI) structure 342 includes a first deep trench isolation structure 342A disposed outwardly (i.e., above in the y-direction) of the first row of pixel cells at the first end 332 of the pixel array, a second deep trench isolation structure 342B disposed outwardly (i.e., below in the y-direction) of the last row of pixel cells at the second end 334 of the pixel array 302, and third deep trench isolation structure 342C disposed between the pixel transistor region PTR and the pixel (e.g., photodiode) region PR of the pixel cells 310. Accordingly, in the example illustrated in FIG. 3, the deep trench isolation structure 342 are interconnected forming a grid-like structure, extending in the X-direction (342A, 342B) and the Y-direction (334C) of the pixel array 302.

The pixel array 302 also includes shallow trench isolation (STI) structure 344 extending a second depth into the semiconductor material 338 from the front side of the semiconductor material 338. In an example embodiment, for the plurality of pixel rows in-between the first and last row of pixel cells, the shallow trench isolation structure 344 includes shallow trench isolation structure 344A (first shallow trench isolation structure) that isolates the photodiodes PD of adjacent pixel cells 310, shallow trench isolation structure 344B (second shallow trench isolation structure) that isolate pixel transistor regions PTR of adjacent pixel cells 310, and shallow trench isolation structure 344C (third shallow trench isolation structure) that isolate sections of the pixel transistor regions PTR of each pixel cell 310. In an example embodiment, shallow trench isolation structure 344C can be also disposed in the pixel transistor regions before the first row of pixel cells and after the last row of pixel cells.

In the example embodiment, the second depth of the shallow trench isolation structure 344 is less than the first depth of the deep trench isolation structure 342 with respect to the front side of semiconductor substrate 338. In one example, the shallow trench isolation structure 344 and the deep trench isolation (DTI) structure 342 are interconnected forming grid-like trench structure providing isolation across pixel array 302. For example, adjacent deep trench isolation (DTI) structure 342C can be formed to interconnect with each other through shallow trench isolation structure 344A and 344B.

For brevity and clarity, pixel cell 310A of the pixel array 302 will now be described in more detail referencing FIG. 4. It will be appreciated that the other pixel cells 310 of the pixel array 302 are constructed substantially identical to the pixel cell 310A, and thus, will not be separately described. As shown in the example depicted in FIG. 4, pixel cell 310A includes a pixel region PR, composed of two subpixel regions SPR1, SPR2, and a pixel transistor region PTR. Embodiments of the pixel cell 310 that include more than one subpixel region "share" the pixel transistor region PTR, and thus, can be referred to as a shared pixel cell.

Figure 4:
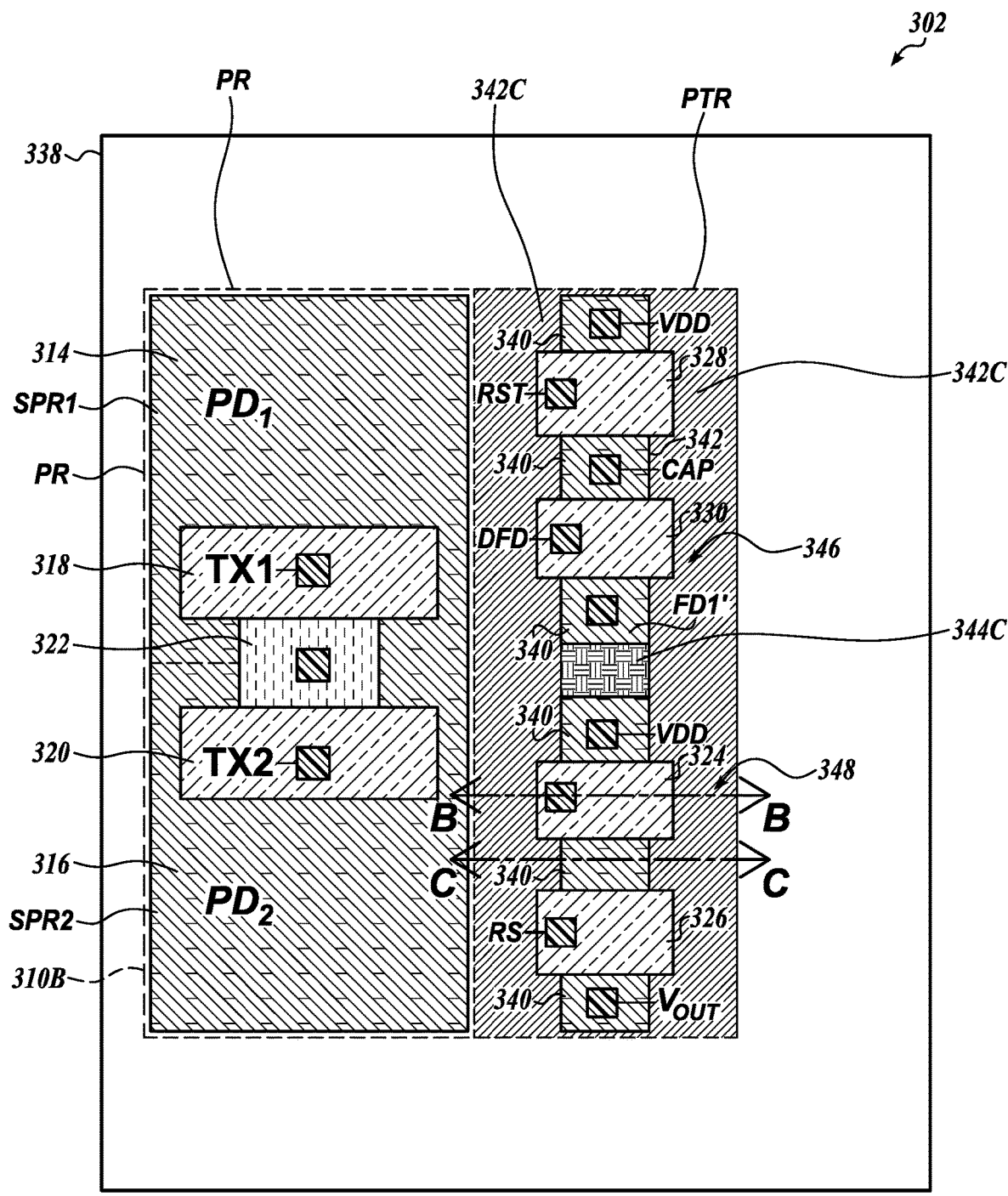
FIG. 4 is a top schematic view of one example of a pixel cell in accordance with an embodiment of the present disclosure.

As shown in the example depicted in FIG. 4, the pixel region PR of the pixel cell 310B includes first and second subpixel regions SPR1, SPR2, also referred to as subpixels. The first and second subpixel regions SPR1, SPR2 include respective first and second photosensitive or photoelectric conversion elements, such as photodiodes (PD) 314, 316. The first and second photodiodes 314, 316 are formed or otherwise disposed in a semiconductor substrate or material 338 by ion implantation. The semiconductor material 338 may comprise, for example, any type of semiconductor body or substrate (e.g., silicon/CMOS bulk, SiGe, SOI, etc.) such as a semiconductor wafer, one or more die on a wafer, or any other type of semiconductor and/or epitaxial layers formed thereon and/or otherwise associated therewith.

In operation, the first and second photodiodes 314, 316 are adapted to photogenerate image charge in response to incident light. In one embodiment, semiconductor substrate or material 338 is of a first conductive type (e.g., P-type). In one example embodiment, the first and second photodiodes 314, 316 are formed of a second conductive type opposite to first conductive type, e.g., n-type pinned photodiodes (NPPDs) formed in a P-type doped semiconductor substrate. As illustrated in the depicted example, the first and second photodiodes 314, 316 can be coupled to the common floating diffusion (FD) 322 via first and second transfer gates 318, 320, respectively.

For example, the common floating diffusion 322 is disposed in the semiconductor material 338 in-between the first and second transfer gates 318, 320. In operation, the first transfer gate 318 is coupled to transfer the image charge from the first photodiode 314 to the common floating diffusion 322 in response to a first transfer gate signal TX1. The second transfer gate 320 is coupled to transfer the image charge from the second photodiode 316 to the floating diffusion 322 in response to a second transfer gate signal TX2.

Still referring to the example depicted in FIG. 4, the pixel transistor region PTR of pixel cell 310A is positioned adjacent the first and second subpixel regions SPR1, SPR2 of the pixel region PR. Within the pixel transistor region PTR, the pixel cell 310A includes a gate 328 and doped regions (i.e., drain and source) for a reset transistor, a gate 330 and doped regions (i.e., drain and source 340) for a dual floating diffusion transistor, a gate 324 and doped regions (i.e., drain and source 340) for an amplifier transistor acting as a source-follower (SF), and a gate 326 and doped regions (i.e., drain and source 340) for a row select transistor.

For example, as shown in the embodiment depicted in FIG. 4, a plurality of transistor gates, including reset transistor gate 328, dual floating diffusion transistor gate 330, amplifier transistor gate 324 and row select gate 326, as well as source/drains 340 are formed or otherwise disposed in/on the semiconductor material 338. In one example, gates are formed of conductive material such as polysilicon material or doped polysilicon material. The source/drains 340, for example, are formed as second conductive type doped regions e.g., n-type doped regions formed by ion implantation. In one example embodiment, the respective gates and sources/drains of the pixel transistor region PTR are generally aligned to form a transistor channel region, such as a (N) channel region, having a length direction corresponding to the Y direction of the semiconductor material 338.

As shown in the example depicted in FIG. 4, contacts are provided on each gate of the pixel region PR for transmission of TX1 and TX2 signals, and on each gate of the pixel transistor region PTR for transmission of RST, DFD, and RS signals. Contacts are also provided on various source/drains 340 for coupling to the capacitor CAP, a voltage, such as voltage VDD, or to output a signal, such as voltage Vout. Other contacts may be provided on one or more source/drains 340 for coupling to, for example, the terminal of the floating diffusion 322. Such a source/drain 340 may be also referred to as part of the first floating diffusion (FD1), and referenced in FIG. 4 as FD1'.

As described above, the pixel cell 310A includes deep trench isolation structure 342C disposed in the front side of the semiconductor material 338. This deep trench isolation structure may be also referred to below as front side deep trench isolation (F-DTI) structure. In an example embodiment, front side deep trench isolation structure 342C is disposed between the pixel transistor region PTR and the pixel region PR of the pixel cells 310. The front side deep trench isolation structure 342C extends a first depth into the semiconductor material 338 that is greater than a second depth of the shallow trench isolation structure 344 extended into the semiconductor substrate or material 338 described below.

As illustrated in the example depicted in FIG. 4, pixel cell 310A also includes shallow trench isolation (STI) structure 344 disposed in the front side of the semiconductor material 338 for isolation purposes. For example, the pixel transistor region PTR of each pixel cell 310 includes shallow trench isolation region 344C positioned between a first transistor section 346 (e.g., reset transistor, dual floating diffusion transistor, etc.) of the pixel transistor region PTR and a second transistor section 348 (e.g., amplifier transistor, row select transistor) of the pixel transition region PTR. The shallow trench isolation structure 344 extends a second depth into the semiconductor material 338 that is less than the first depth of the front side deep trench isolation structure 342. The shallow trench isolation structure 344 may be interconnected with front side deep trench isolation structures 342C providing isolations between sections within pixel transition region PTR and between pixel region PR and pixel transition region PTR.

As briefly discussed above and discussed in more detail below, example embodiments in accordance with the methodologies and technologies of the disclosure are directed to a pixel cell having an arrangement of trench isolation structures, including both front side deep trench isolation structure and front side shallow trench isolation structure that isolate the transistor channel regions from the pixel regions (e.g., photodiodes) of the pixel array. Example embodiments also include deep (N) doped wells that extend beneath the pixel transistor regions in order to "float" the P-well regions of the pixel transistor regions, as will be described in greater detail below.

Also as will be described in more detail below, a variety of materials and fabrication techniques may be utilized to form the pixel array 302. The semiconductor material 338 may have a composition of Si (e.g., single crystal or polycrystalline Si). The gates may have a composition including tungsten or polycrystalline silicon. Dielectric layers (not shown) may have a composition of silicon oxide $SiO_2$, hafnium oxide $HfO_2$, or any other suitable dielectric medium known by one of ordinary skill in the art. Contacts may be constructed of any doped material with low ohmic resistivity. Other metals, semiconductors, and insulating materials may also be utilized for pixel array 302, as known by one of ordinary skill in the art. Doped regions in the semiconductor substrate or material may be formed by diffusion, implantation, and the like. It will be appreciated that the doping polarities and/or doping types (e.g., P-type, N-type, etc.) in the illustrative embodiments may be reversed in alternative embodiments. Fabrication techniques such as photolithography, masking, chemical etching, ion implantation, thermal evaporation, chemical vapor deposition, sputtering, and the like, as known by one of ordinary skill in the art, may be utilized to fabricate the pixel cell 310, the pixel array, 302, and/or the image sensor 100.

FIGS. 5A-5C are cross-section views of portions of a pixel array, such as pixel array 302, taken along line A-A of FIG. 3, and along lines B-B and C-C of FIG. 4, respectively. FIG. 5A depicts a longitudinal cross section of the pixel array 302 through the pixel transistor regions PTR of the pixel cells 310 from the first end 332 of the pixel array 302 to the second end 334 of the pixel array 302. FIG. 5B is a lateral cross-section view of the pixel transistor region PTR of pixel cell 310A of FIG. 4 across amplifier transistor gate 324 i.e., along a channel width direction of the amplifier transistor or along line B-B. As such, FIG. 5B depicts a cross sectional view across the pixel transistor region PTR of pixel cell 310A, which is disposed adjacent pixel region PR of pixel cell 310A and the pixel region PR of an adjacent pixel cell. FIG. 5C is a lateral cross-section view of the pixel transistor region PTR of pixel cell 310A of FIG. 4 through a source/drain region 340 along line C-C.

As shown in the example depicted in FIG. 5A, the pixel transistor regions PTR are formed or otherwise disposed in a semiconductor substrate or material 338 having a first surface 354 (e.g., front side 354) and a second surface 356 (e.g., back side 356) opposite to the first surface 354. The semiconductor material 338 is of a first conductive type e.g., P-type doped semiconductor material. In an example embodiment, the semiconductor material 338 is approximately 3.0 µm-6.0 µm thick, although other semiconductor material thicknesses may be employed.

As shown in the example depicted in FIG. 5A, the pixel transistor region PTR of each pixel cell 310 includes a plurality of transistor gates, including reset transistor gate 328, dual floating diffusion transistor gate 330, amplifier transistor gate 324 and row select gate 326, as well as source/drains 340 formed or otherwise disposed in/on the front side 354 of the semiconductor material 338. In one example embodiment, the respective gates and sources/drains of the pixel transistor region PTR are generally arranged to form a transistor channel region, such as a (N) channel region, having a length direction corresponding to the y-direction of the semiconductor substrate or material 338 as depicted in FIG. 3.

As shown in the example depicted in FIGS. 5A-5C, a first doped well region 382 of the first conductive type or a first P-well (PW1) region 382 is disposed in semiconductor material 338, which extends depthwise into the semiconductor material 338 from the front side 354 of the semiconductor material 338. For each pixel cell, the first P-well region 382 is positioned beneath the transistor gates 324, 326, 328, 330 and surrounds the source/drains 340 associated with pixel transistors. The first P-well region 382 is arranged to have floating diffusions of a second conductive type opposite to first conductive type (e.g., floating diffusions FD1', FD2). The source/drain 340 of pixel transistors (e.g., reset transistor, source follower, dual floating diffusion transistor, row selection transistor) of the second conductive type are formed in in the first P-well region 382.

In an example embodiment, the first P-well region 382 extends longitudinally (e.g., in the y-direction) from the first row of pixel cells to the last row of pixel cells, as shown in FIG. 5A, and extends laterally (e.g., in the x-direction) between deep trench isolation structure 342C, as shown in FIGS. 5B-5C. In an example embodiment, the first P-well region 382 is implanted, for example, with P-type dopant (boron (B), aluminum (Al), etc.) at a dosage level of approximately E12/cm$^2$.

A thin film dielectric layer, such as dielectric layer 370, is disposed on the semiconductor substrate 338. Portions of the thin film dielectric layer 370 disposed underneath the transistor gates function as gate oxide, and other portions of the thin film dielectric layer 370 disposed on the semiconductor substrate 338 passivate the front side surface of the semiconductor substrate 338. The thin film dielectric layer 370 may be formed by thermal oxidation or oxidation deposition. In some embodiments, the first P-well region 382 extends into the front side 354 of the semiconductor material 338 a depth of about 1.5 μm.

The pixel array 302 also includes a second doped well region 384 of the first conductive type or P-well (PW2) region 384 extending depthwise into the semiconductor material 338 from the back side 356 of the semiconductor material 338. In the illustrated embodiment of FIGS. 5A-5C, the second P-well region 384 extends laterally from the first end 332 of the pixel array 302 to the second end 334 of the pixel array 302, the upper region of which is adjacent the lower portion of the deep trench isolation structure 342A, 342 B. In an example embodiment, the second P-well region 384 is coupled to ground to provide transistor operation reference.

Still referencing FIGS. 5A-5C, a deep doped well region 386 of the second conductive type or deep N-well (DNW) region 386 is disposed in the semiconductor substrate or material 338, e.g., P-type doped semiconductor material 338, to separate the first and second P-well regions 382, 384. In an example embodiment, the deep N-well region 386 is implanted, for example, with arsenic (As) at a depth of about 1.5 μm with respect the front side of semiconductor substrate, with a dosage level of approximately E13/cm$^2$ and greater than the dosage level of first and second P well regions 382, 384 for providing isolation between the first and second P well regions 382, 384. The deep (N) doped well region or deep N-well (DNW) region 386 electrically isolated the first doped well region 382 and the second doped well region 384. In one example, the first doped well region 382 and the second doped well region 384 may be formed in the same implantation process and thereafter counter-doped with a deep (N) doped well region 386 having greater dopant concentration to separate the first doped well region 382 and the second doped well region 384.

In the example depicted in FIG. 5A, the pixel array 302 also includes front side deep trench isolation structure (F-DTI) 342 extending a first depth into the semiconductor material 338 from the front side 354 of the semiconductor material 338. For example, front side deep trench isolation structure 342 includes a first deep trench isolation structure 342A disposed outwardly (i.e., above in the y-direction) of the first row of pixel cells at the first end 332 of the pixel array 302 and a second deep trench isolation structure 342B disposed outwardly (i.e., below in the y-direction) of the last row of pixel cells at the second end 334 of the pixel array 302. In the example depicted in FIGS. 5B, 5C, the front side deep trench isolation structure 342 includes third deep trench isolation structure 342C disposed between the pixel transistor region and the pixel region of the pixel cells 310. In an example embodiment, the deep trench isolation structure 342 extends into the semiconductor material 338 a first depth that is greater than the depth of the deep (N) well region 386 with respect to the front side 354 of the semiconductor material 338, and in some embodiments, extends to a depth of approximately 2.4-2.5 μm. In some embodiments, the front side deep trench isolation structure 342 include a dielectric fill material (e.g., silicon oxide).

In the illustrated embodiment, the deep N-well region 386 extends between the deep trench isolation structure 342A proximate the first end 332 of the pixel array 302 and the deep trench isolation structure 342B proximate the second end 334 of the pixel array 302. In one example, the deep N-well region 386 is formed adjacent the sides of deep trench isolation structure 342A and deep trench isolation structure 342B.

The pixel transistor regions PTRs of the pixel array 302 also include shallow trench isolation (STI) structure 344 extending a second depth into the semiconductor material 338 from the front side 354 of the semiconductor substrate or material 338. For example, shallow trench isolation structure 344 includes shallow trench isolation structure 344A that isolates the photodiodes PD of adjacent pixel cells 310, shallow trench isolation structure 344B that isolate pixel transistor regions PTR of adjacent pixel cells 310, and shallow trench isolation structure 344C that isolate sections of the pixel transistor regions PTR of each pixel cell 310. In the example embodiment, the second depth of the shallow trench isolation structure 344 is less than the first depth of the deep trench isolation structure 342. The second depth of the shallow trench isolation structure 344 is less than the implant depth of the deep doped well region 386. In an example embodiment, the shallow trench isolation structure 344 extends into the semiconductor material 338 a second depth between approximately about 0.6 μm and about 1.5 μm. In some embodiments, the shallow trench isolation structure 344 include a dielectric fill material (e.g., silicon oxide).

In the example depicted in FIG. 5A, the pixel array 302 further includes a first doped well region 390A of the second conductive type or N-well region 390A disposed above the deep N-well region 386 adjacent the deep trench isolation structure 342A at the first end 332 of the pixel array 302. The N-well region 390A contacts the top of the deep N-well region 386, and is adjacent the sides of deep trench isolation structure 342A and P-well region 382, respectively. The N-well region 390A also is adjacent the shallow trench isolation structure 344C at the first end 332. In an example embodiment, the N-well region 390A is implanted, for example, with arsenic (As) at depths of about 0.30 µm, about 0.9 µm, and about 1.5 µm from the front side 354 of the semiconductor substrate 338. Disposed above the N-well region 390A and sandwiched between the deep trench isolation structure 342A and the shallow trench isolation structure 344C is a source/drain 340 for providing biasing voltage to the N-well regions 390A and the deep N-well region 386. In an example embodiment, the source/drain 340 can be coupled to a voltage, such as a biased voltage VDD through a metal contact. In embodiments, the source/drains 340 disposed above the respectively N-well regions 390A, 390B may have higher dopant concentration (e.g., heavily doped) than the N-well regions 390A, 390B.

Similarly, the pixel array 302 includes a second doped well region 390B of the second conductive type or N-well region 390B disposed above the deep N-well region 386 adjacent the deep trench isolation structure 342A at the first end 332 of the pixel array 302. The N-well region 390B contacts the top of the deep N-well region 386, and is adjacent the sides of deep trench isolation structure 342B and P-well region 382, respectively. The N-well region 390B also contacts the shallow trench isolation structure 344C at the second end 334. In an example embodiment, the N-well region 390B is implanted, for example, with arsenic (As) at depths of about 0.30 µm, about 0.9 µm, and about 1.5 µm from the front side 354 of the semiconductor substrate 338. Disposed above the N-well region 390B and sandwiched between the deep trench isolation structure 342B and the shallow trench isolation structure 344C is a source/drain 340 for providing biasing voltage to the N-well regions 390A and the deep N-well region 386. In an example embodiment, the source/drain can be coupled to a voltage, such as the biased voltage VDD through a metal contact. The first doped well region 390A and the second doped well region 390B electrically connect the deep N-well region 386. Accordingly, the deep N-well region 386 is clamped at a biased voltage determined by the supply voltage VDD.

The deep trench isolation structures (F-DTI) 342A, 342B, 342C, the first doped well region 390A, the second doped well region 390B, the deep N-well region 386 collectively form an isolation structure isolating the first doped well region 382 of a pixel transistor region PTR from the first doped well region 382 of other pixel transistor region PTR and from second doped well region 384. This arrangement allows each the first doped well region 382 containing floating diffusion (FD1', FD2) and source/drain regions of the pixel transistors in the pixel array 302 to be floating for eliminating junction leakage path such that no current is flowing in the first doped well region 382, thereby preventing junction leakage.

In one embodiment, the potential of first doped well region 382 may be determined based on the biased voltage (e.g., VDD) applied to the deep N-well region 386, junction voltage associated with the first doped well region 382 and the N-well region 390A or 390B, junction voltage associated with the first doped well region 382 and the deep N-well region 386, and junction voltage associated with the deep N-well region 386 and the second doped well region 384 and the potential (e.g., ground) of the second doped well region 384. As such, the threshold voltage of the pixel transistors formed in the first doped well region 382 may be adjusted based on the biased voltage.

Figure 6:
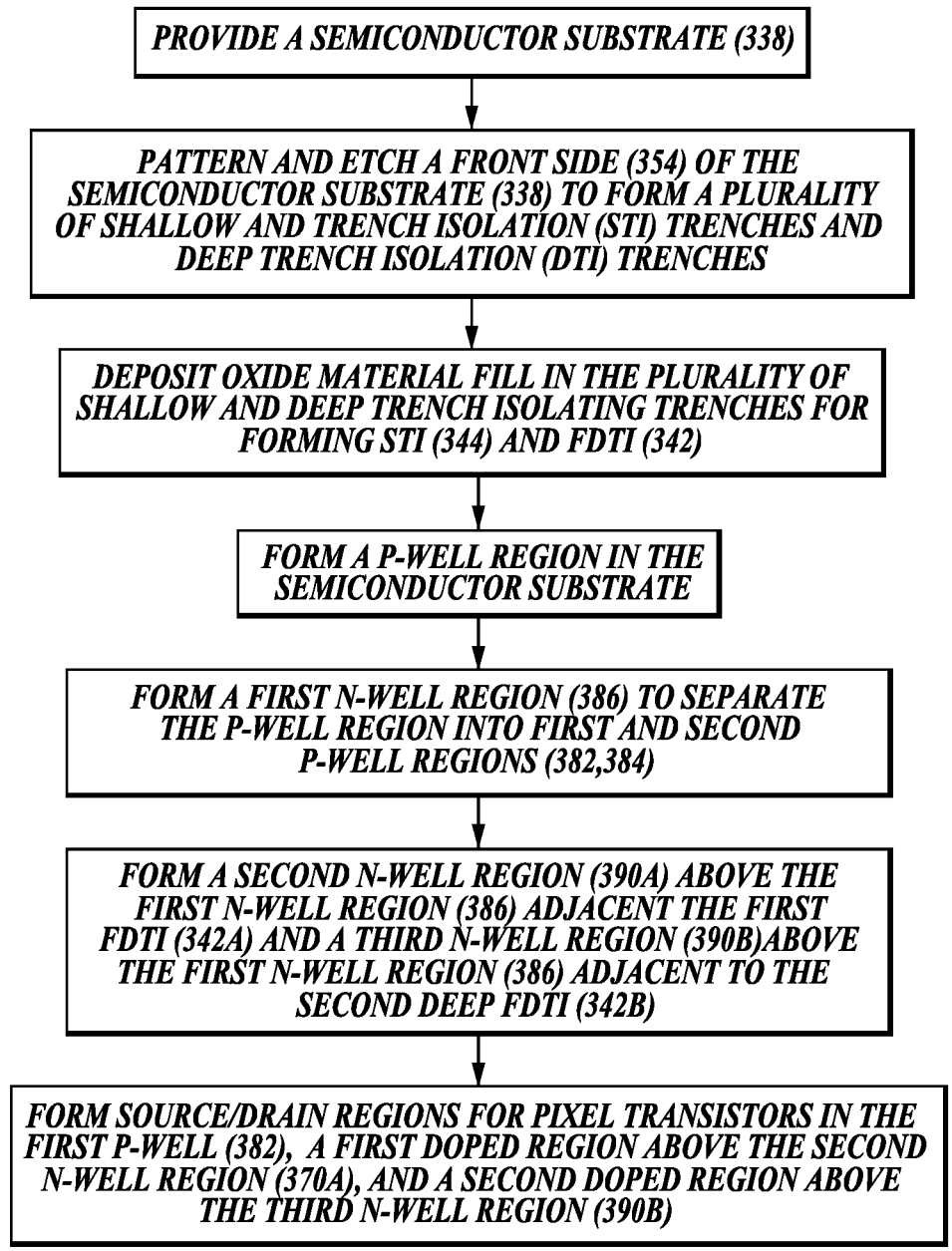
FIG. 6 is an example flow chart for fabricating the pixel array of FIG. 3 in accordance with an embodiment of the present disclosure.

FIG. 6 is a flow chart illustrating one example of a method for fabricating a pixel array, such as pixel array 302, in accordance with the teachings of the present disclosure. It will be appreciated that the following method steps can be carried out in any order or at the same time, unless an order is set forth in an express manner or understood in view of the context of the various operation(s). Additional process steps can also be carried out, including chemical-mechanical polishing, masking, additional doping, etc.

Referring to the example method depicted in FIG. 6, and referencing FIGS. 3, 4A-4C, in one example, the present disclosure features, inter alia, a method of fabricating a pixel array comprising the following steps: providing a semiconductor material or substrate 338, forming a plurality of front side deep trench isolation (FDTI) structures extending a first depth in semiconductor material 338, such as front side deep trench isolation structures 342A, 342B, and 342C, forming a plurality of front side shallow trench isolation (STI) structure, such as front side shallow trench isolation structures 344, extending a second depth that is less than the first depth, forming first and second P-well regions 382, 384 in the semiconductor substrate 338 extending between front side deep trench isolation structure 342A, 342B, respectively, forming a deep N-Well region, such as deep N-well region 386, in between the first and second P-Well regions 382, 384 separating the first and second P-Well regions 382 and between front side deep trench isolation structures 342A, 342B, forming first and second N-Well regions, such as N-well regions 390A, 390B, above the deep N-Well region 386 adjacent the front side deep trench isolation structures 342A, 342B, respectively, wherein first and second N-Well regions electrically connect the deep N-Well region 386.

An embodiment of the method further comprises the step of forming first and second doped regions, such as first and second source/drains 340, above the first and second N-Well regions 390A, 390B adjacent the front side deep trench structures 342A, 342B, respectively. In an example embodiment, the first and second source/drains 340 can be sandwiched, respectively between the front side deep trench isolation structure 342A, 342B and other front side trench isolation structure, such as shallow trench isolation structure 344C. In an example embodiment, the second P-well region 384 can be coupled to ground, and the first and second doped regions 340 can be coupled to a power supply to clamp the N-Well region 386 at a biased voltage of the power supply. As a result, the first P-well region 382, which can contain the pixel transistors of the pixel transistor region PTR, can be configured to be floating.

In some example embodiments of the method, forming the front side shallow trench isolation structure 344 includes first forming front side shallow trench isolation (STI) trenches by patterning and etching a front side 354 of the semiconductor substrate or material 338. For example, the front side 354 of the semiconductor substrate or material 338 is patterned and etched (e.g., via dry and/or wet etching) for forming trenches that will subsequently create front side shallow trench isolation structure 344. In an example embodiment, the shallow trench isolation (STI) trenches are formed between pixel regions of adjacent pixel cells in, for example, the middle rows of pixel cells, and formed between pixel transistor regions of adjacent pixel cells in, for example, the middle rows of pixel cells, as shown in FIGS. 3, 4A-4C.

In some example embodiments of the method, forming the front side deep trench isolation structure 344 includes first, forming front side deep trench isolation (FDTI) trenches by patterning and etching a front side 354 of the semiconductor substrate or material 338. For example, the front side 354 of the semiconductor substrate or material 338 is patterned and etched (e.g., via dry and/or wet etching) for forming trenches that will subsequently create front side deep trench isolation structure 342. In an example embodiment, the following front side deep trench isolation (DTI) trenches are formed, as shown in FIG. 3, 4A-4C:

first front side (DTI) trenches formed above a first row of pixel cells adjacent the first end 332 of the pixel array 302;

second front side (DTI) trenches formed below the last row of pixel cells adjacent the second end 334 of the pixel array 302; and a plurality of third front side (DTI) trenches formed between the pixel transistor region and pixel region of each pixel cell from the first row of pixel cells to the last row of pixel cells.

The method continues as follows. After the front side (STI) and (DTI) trenches are formed, oxide material (e.g., silicon oxide) fill is deposited in the formed front side trenches for forming front side deep trench structure 342 and front side shallow trench structure 344. In one embodiment, oxide material deposition may further form a thin dielectric material layer on the front side of semiconductor material. Optionally, a chemical mechanical polishing process can be applied thereafter. Next, a P-well region is formed in the semiconductor substrate 338 extending between front side deep trench structures 3422A, 342B. The P-well region can be formed by any conventional process, such as ion implantation, etc. In an example embodiment, the P-well region is implanted, for example, with P-type dopant (boron (B), aluminum (Al), etc.) at a dosage level of approximately E12/cm2.

A first N-Well region 386 is then formed to separate the P-well region into first and second P-Well regions 382, 384. In that regard, the N-Well region 386 extends between front side deep trench structure 3422A, 342B, thereby floating the first P-well region 382 having floating diffusion and source/drains of pixel transistors formed therein. As such, any junction leakage path associated with floating diffusion region can be eliminated preventing junction leakage. Again, the N-well region 386 can be formed by any conventional process, such as ion implantation, etc. In an example embodiment, the deep N-well region 386 is implanted, for example, with arsenic (As) at a depth of about 1.5 μm, with a dosage level of approximately E13/cm2. In an embodiment, the second P-well region 384 can be coupled to ground.

The method continues in which a second N-Well region 390A is formed above the first N-Well region 386 adjacent the first deep trench isolation structure 342A and a third N-Well region 390B is formed above the first N-Well region 386 adjacent the second deep trench isolation structure 342B. The first and second N-well regions 390A, 390B, can be formed by any conventional process, such as ion implantation, etc. In an example embodiment, the first and second N-well regions 390A, 390B are implanted, for example, with arsenic (As) at depths of about 0.30 μm, about 0.9 μm, and about 1.5 μm with respect to front side of the semiconductor substrate or material 388.

Once the first, second and third N-well regions 386, 390A, 390B are formed, the method continues, for example, by forming source/drain regions 340 for the pixel transistors in the first P-well region 382, forming a first heavily doped region above the first N-Well region 390A and adjacent the front side deep trench structure 342A, and forming a second heavily doped region above the third N-Well region 390B and adjacent front side deep trench structure 342B. In an example embodiment, the first and second heavily doped regions can be coupled to a power supply to clamp the first N-Well region 386 at a biased voltage of the power supply.

Of course, additional process steps can then be carried out, including chemical-mechanical polishing, as well as formation of the transistor gates on the front side 354 of the semiconductor substrate 338. Similarly, the photodiodes, floating diffusion transfer gates, doped well, etc., for the pixel or pixel regions PR can be formed, if not already completed.

While example embodiments described above relate to a shared pixel cell, other architectures, including non-shared pixel cells (e.g., one photosensitive region per pixel transistor region) may employ the methodologies and technologies of the present disclosure. Also, the present application may reference quantities and numbers. Unless specifically stated, such quantities and numbers are not to be considered restrictive, but exemplary of the possible quantities or numbers associated with the present application. Further in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The above description of illustrated examples of the present disclosure, including what is described in the Abstract, are not intended to be exhaustive or to be a limitation to the precise forms disclosed. While specific embodiments of, and examples for, the present disclosure are described herein for illustrative purposes, various equivalent modifications are possible without departing from the broader spirit and scope of the claimed subject matter. Indeed, it is appreciated that the specific example voltages, currents, frequencies, power range values, times, etc., are provided for explanation purposes and that other values may also be employed in other embodiments and examples in accordance with the teachings of the present disclosure.

These modifications can be made to examples of the disclosed subject matter in light of the above detailed description. The terms used in the following claims should not be construed to limit the claimed subject matter to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel array having a first end and a second end, the pixel array comprising:

a semiconductor substrate having a front side and a back side;
a plurality of pixel cells formed in the semiconductor substrate and arranged in a matrix, the plurality of pixel cells comprising a first row of pixel cells adjacent to the first end, a last row of pixel cells adjacent to the second end, and a plurality of middle rows of pixel cells disposed between the first and last rows of pixel cells, each pixel cell included in the plurality of pixel cells comprising a pixel region having at least one photosensitive element and a pixel transistor region;
a front side deep trench isolation structure extending a first depth into the front side of the semiconductor substrate; and
a front side shallow trench isolation structure extending a second depth into the front side of the semiconductor substrate, wherein the second depth is less than the first depth;
wherein the front side deep trench isolation structure includes a first deep trench isolation structure disposed above the first row of pixel cells adjacent to the first end of the pixel array, a second deep trench isolation structure disposed below the last row of pixel cells adjacent to the second end of the pixel array, and a plurality of third deep trench isolation structures disposed between the pixel transistor region and pixel region of the each pixel cell from the first row of pixel cells to the last row of pixel cells;
wherein the front side shallow trench isolation structure is positioned between the pixel regions of adjacent pixel cells in the plurality of middle rows of pixel cells and further positioned between the pixel transistor regions of the adjacent pixel cells in the plurality of middle rows of pixel cells.

2. The pixel array of claim 1 wherein the first deep trench isolation structure, the second deep trench isolation structure, and the plurality of third deep trench isolation structure form a frontside deep trench isolation grid structure.

3. The pixel array of claim 1 wherein the pixel transistor region of the each pixel cell included in the plurality of pixel cells includes a first doped well region having a first conductivity type, a second doped well region having the first conductivity type, and a third doped well region separating the first doped well region from the second doped well region and having a second conductivity type that is different from the first conductivity type.

4. The pixel array of claim 3 wherein the pixel transistor region of the each pixel cell included in the plurality of pixel cells includes a plurality of transistor gates and a plurality of source/drains associated with the plurality of transistors, the first doped well region being positioned beneath the plurality of transistor gates and in surrounding relationship with the plurality of source/drains.

5. The pixel array of claim 4 wherein a first side of the third doped well region is disposed adjacent to the first deep trench isolation structure, and wherein a second side of the third doped well region is disposed adjacent to the second deep trench isolation structure so as to isolate the first doped well region from the second doped well region.

6. The pixel array of claim 5 wherein the first doped well region is floating and the second doped well region is coupled to ground.

7. The pixel array of claim 6 wherein one of the plurality of source/drains is connected to a voltage source.

8. The pixel array of claim 3 further comprising
a fourth doped well region having the second conductivity type and positioned at the first end adjacent to the first deep trench isolation structure; and
a fifth doped well region having the second conductivity type and positioned at the second end adjacent to the second deep trench isolation structure.

9. The pixel array of claim 8 wherein the fourth doped well region and the fifth doped well region are positioned above and in contact with the third doped well region, and wherein the fourth doped well region and the fifth doped well region are electrically connected to the third doped well region.

10. The pixel array of claim 8, further comprising a first doped region and a second doped region each having the second conductivity type and extending from the front side of the semiconductor substrate, wherein the first and second doped regions electrically connect the fourth and fifth doped well regions, respectively, and wherein the first and second doped regions are adapted to be coupled to a power supply V1 in order to clamp the third doped well region at a biased voltage of the power supply V1.

11. The pixel array of claim 3 wherein the first and second doped well regions are P type doped well regions, and wherein the third doped well region is an N type doped well region.

12. The pixel array of claim 3, wherein the deep trench isolation structure extends a depth into the semiconductor substrate that is greater than an implant depth of the third doped well region.

13. A method for fabricating a pixel array in a semiconductor substrate having a front side and a back side, the pixel array having a plurality of pixel cells formed in the semiconductor substrate and arranged in a matrix, each pixel cell included in the plurality of pixel cells comprising a pixel region having at least one photosensitive region and a pixel transistor region, the method comprising:
forming, in the front side of the semiconductor substrate, a deep trench isolation structure having a first depth;
forming, in the front side of the semiconductor substrate, a shallow trench isolation structure having a second depth that is less than the first depth,
wherein the deep trench isolation structure includes a first deep trench isolation structure disposed above a first row of pixel cells adjacent to a first end of the pixel array, a second deep trench isolation structure disposed below a last row of pixel cells adjacent to a second end of the pixel array, and a plurality of third deep trench isolation structures disposed between the pixel transistor region and pixel region of the each pixel cell from the first row of pixel cells to the last row of pixel cells, and wherein the plurality of pixel cells further includes a plurality of middle rows of pixel cells disposed between the first and last rows of pixel cells;
wherein the shallow trench isolation structure includes a first shallow trench isolation structure positioned between the pixel regions of adjacent pixel cells associated with the plurality of middle rows of pixel cells, and a second shallow trench isolation structure positioned between the pixel transistor regions of the adjacent pixel cells associated with the plurality of middle rows of pixel cells.

14. The method of claim 13, further comprising
forming first and second doped well regions in the semiconductor substrate that extend between the first and second deep trench isolation structures, the first and second doped well regions each having a first conductivity type.

15. The method of claim 14, further comprising forming a third doped well region between the first and second doped well regions, wherein the third doped well region has a second conductivity type that is different than the first conductivity type of the first and second doped well regions, the first and second deep trench isolation structures extending a depth in the semiconductor substrate that is greater than an implant depth of the third doped well region.

16. The method of claim 15, further comprising
forming a fourth and a fifth doped well regions above and electrically coupled to the third doped well region adjacent to the first and second deep trench isolation structures, respectively, the fourth and fifth doped regions formed of the second conductivity type.

17. The method of claim 16, further comprising
forming a first and a second heavily doped regions above the fourth and fifth doped well regions adjacent to the first and second deep trench structures, the first and the second heavily doped regions formed of the second conductivity type.

18. The method of claim 17, further comprising
coupling the second doped well region to ground; and
coupling the first and second heavily doped regions to a power supply for clamping the third doped well region at a biased voltage of the power supply.

19. The method of claim 18, further comprising
forming a plurality of transistor gates on the front side of the semiconductor substrate; and
forming a plurality of source/drains in the semiconductor substrate,
wherein the first doped well region is positioned beneath the plurality of transistor gates and in surrounding relationship with the plurality of source/drains.

20. The method of claim 17 wherein the fourth and fifth doped well regions are disposed at a plurality of depths with respect to the front side of the semiconductor substrate, and wherein the implant depth of the third doped well region is greater than any of the plurality of depths of the fourth and fifth doped well regions, and wherein the third, fourth, and fifth doped well regions are N-type doped well regions.

* * * * *